United States Patent
Mirgorodski et al.

(10) Patent No.: US 7,969,790 B2
(45) Date of Patent: Jun. 28, 2011

(54) METHOD OF ERASING AN NVM CELL THAT UTILIZES A GATED DIODE

(75) Inventors: Yuri Mirgorodski, Sunnyvale, CA (US); Peter J. Hopper, San Jose, CA (US); Roozbeh Parsa, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/884,519

(22) Filed: Sep. 17, 2010

(65) Prior Publication Data

US 2011/0007574 A1    Jan. 13, 2011

Related U.S. Application Data

(62) Division of application No. 12/539,872, filed on Aug. 12, 2009, now Pat. No. 7,859,912, which is a division of application No. 11/371,410, filed on Mar. 9, 2006, now abandoned.

(51) Int. Cl.
G11C 11/34 (2006.01)
G11C 16/04 (2006.01)
(52) U.S. Cl. .......... 365/185.29; 365/185.26; 365/185.27
(58) Field of Classification Search .............. 365/185.26, 365/185.27, 185.29
See application file for complete search history.

(56) References Cited

U.S. PATENT DOCUMENTS 5,907,171 A * 5/1999 Santin et al. .................. 257/315

* cited by examiner

*Primary Examiner* — Ly D Pham
(74) *Attorney, Agent, or Firm* — Dergosits & Noah LLP

(57) ABSTRACT

A method of erasing an NVM cell structure formed on a deep well of N-type semiconductor material, wherein the NVM cell structure includes a PMOS transistor formed in an N-type well, the PMOS transistor including spaced-apart p-type source and drain regions defining an n-type channel region therebetween, an NMOS transistor formed in a P-type well that is adjacent to the N-type well, the NMOS transistor including spaced-apart n-type source and rain regions defining a p-type channel region therebetween, a conductive floating gate that includes a first section that extends over the n-type channel region of the PMOS transistor and is separated therefrom by intervening dielectric material and a second section that extends over the p-type channel region and is separated therefrom by intervening dielectric material, and a conductive control gate formed over at least a portion of the second section of the floating gate and separated therefrom by intervening dielectric material, the erasing method comprising: biasing the deep N-type well at a selected erase voltage; holding the source and drain regions of the PMOS transistor at the erase voltage or floating; and holding the control gate at ground for a preselected erase time.

2 Claims, 2 Drawing Sheets

US 7,969,790 B2

METHOD OF ERASING AN NVM CELL THAT UTILIZES A GATED DIODE

RELATED APPLICATIONS

This application is a divisional of application Ser. No. 12/539,872, filed on Aug. 12, 2009, by Mirgorodski et al., which is a divisional of application Ser. No. 11/371,410, filed on Mar. 9, 2006, by Mirgorodski et al., now abandoned

TECHNICAL FIELD

The present invention relates to integrated circuits and, in particular, to a method of erasing a non-volatile memory (NVM) cell and array structure wherein the cells utilize gated diodes that are used to program a large number of cells at the same time, thereby reducing the effective programming time per bit, while consuming low programming current.

DETAILED DESCRIPTION OF THE INVENTION

The present invention provides enhancements to the well-known stacked gate non-volatile memory (NVM) cell design disclosed in U.S. Pat. No. 4,698,787, issued to Mukherjee et al. on Oct. 6, 1987, titled "Single Transistor Electrically Programmable Memory Device and Method" and its modification as disclosed, for example, in U.S. Pat. No. 6,137,723, issued on Oct. 24, 2000, titled "Memory Device Having Erasable Frohmann-Bentchkowsky EPROM Cells That Use a Well-to-Floating Gate Coupled Voltage During Erasure."

A typical NVM cell, such as is used in electrically erasable programmable memory (EEPROM) devices, uses two components: a transistor and a capacitor. In a classical stacked gate cell, such as the cell disclosed in the above-cited '787 patent, a second polysilicon layer is used to create the capacitor. In an alternative design, such as that disclosed in the above-cited '723 patent, a well-to-floating gate capacitor is used. Both of these designs utilize the transistor to perform the program and read functions; the erase function is performed through the transistor or through the capacitor, coupling to the capacitor to optimize operating voltages. A 4-transistor cell alternative, such as that disclosed in U.S. Pat. No. 6,992,927, issued on Jan. 31, 2006, to Poplevine et al., utilizes a separate, designated transistor to perform each function and, therefore, does not require high voltage switches.

The traditional programming methods are based upon hot electron injection in conditions created in the programming transistor. In the more common implementation, the hot electrons are injected from the channel when the source/drain current is high. In alternative implementations, e.g. U.S. Pat. No. 6,862,216 and the above-cited '927 patent, electrons are generated by band-to-band tunneling when current consumption is lower by a few orders of magnitude.

Figure 1:
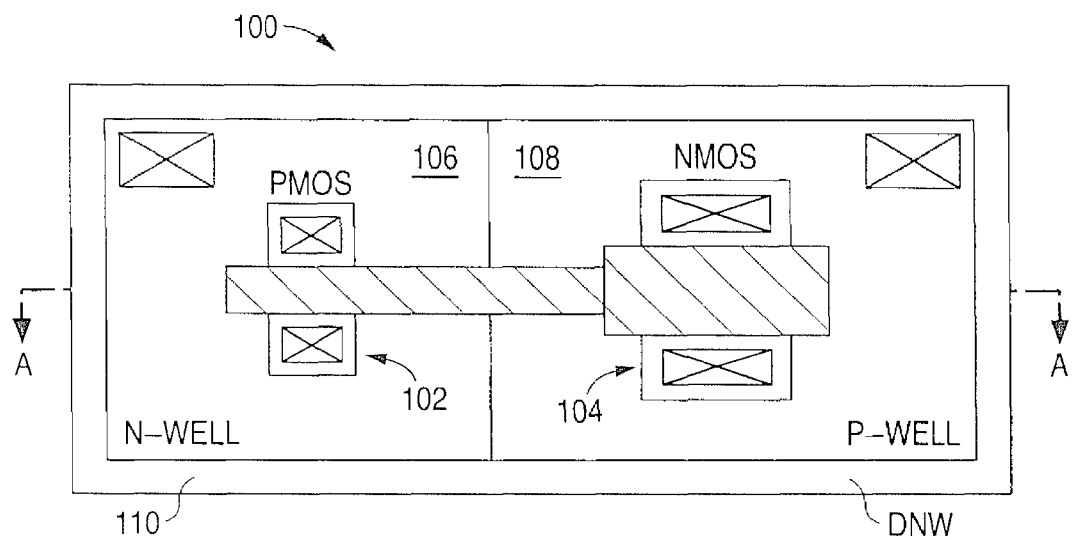
FIG. 1 is a plan view drawing illustrating an embodiment of a layout of a NVM cell structure in accordance with the concepts of the present invention.

FIG. 1 shows an NVM cell structure 100 in accordance with the present invention. The NVM cell structure 100 includes a PMOS transistor 102, which is used for programming and reading the cell, and an NMOS transistor 104, which is used as a capacitive control gate. As discussed in greater detail below, for a programming operation, the PMOS transistor 102 operates as two gated diodes because both the source and drain p-n junctions are at the same reverse bias that results in effective programming with low current consumption. As shown in FIG. 1, the PMOS transistor is formed in an N-well 106 and the NMOS transistor is formed in a P-well 108 that is adjacent to the N-well 106, thereby enabling the use of mid-size cells and mid-density cell arrays. The N-well 106 and the P-well 108 are formed on deep N-well (DNW) 110. As is well known, the PMOS device 102 includes spaced-apart p-type source and drain regions that define an n-type channel region therebetween; the NMOS device includes spaced-apart n-type source and drain regions that define a p-type channel region therebetween.

Figure 2:
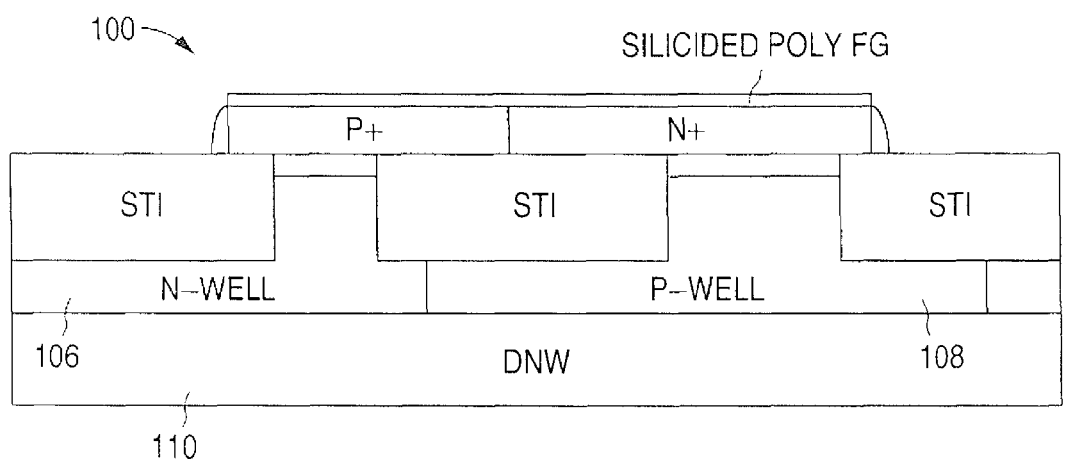
FIG. 2 is a partial cross-section drawing illustrating the FIG. 1 NVM cell structure.

FIG. 2 shows a cross-section of the FIG. 1 cell structure 100 taken through line A-A in FIG. 1. As shown in FIG. 2, the silicided polysilicon floating gate FG of the cell structure 100, which is separated from the underlying channel region by intervening dielectric material (e.g. silicon dioxide) includes a P+ doped region for the PMOS device 102 and an N+ doped region for the NMOS device 104. Those skilled in the art will appreciate that the floating gate FG can be fabricated and doped using a conventional sequence of masking and doping modules to arrive at the dual P+/N+ structure shown in FIG. 2.

Compared to previous devices, the cell structure 100 shown in FIGS. 1 and 2 is significantly smaller than the 4-transistor cell referenced above, but requires switches. It is smaller than conventional single poly cells in which the transistors are placed in separate wells, but larger than the stacked-gate cell.

Figure 3:
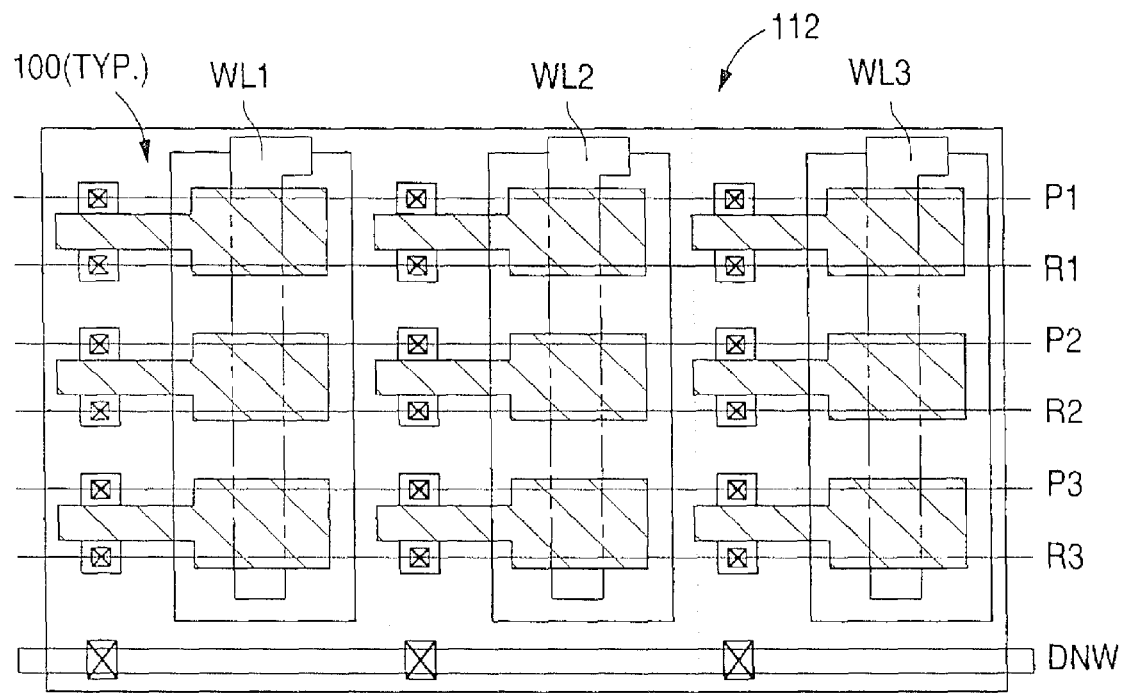
FIG. 3 is a plan view drawing illustrating an NVM array that utilizes the NVM cell structure shown in FIGS. 1 and 2.

FIG. 3 shows an NVM cell array 112 that utilizes cells 100 of the type discussed above with respect to FIGS. 1 and 2. As discussed in greater detail below, all of the cells 100 in the FIG. 3 array can be erased at the same time (flash). As further discussed below, all of the cells 100 of a word line (WL1, WL2 and WL3 in the FIG. 3 array embodiment) can be programmed at the same time.

Figure 4:
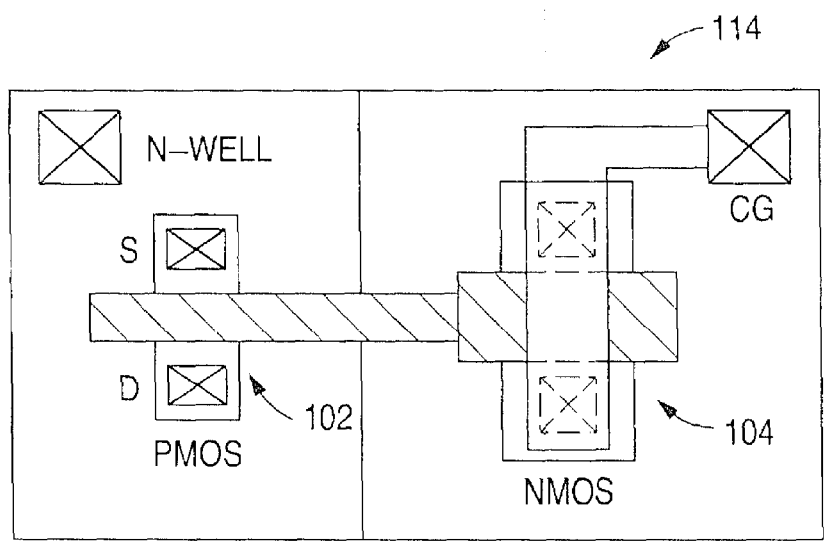
FIG. 4 is plan view drawing illustrating an embodiment of a layout of a NVM cell structure in accordance with the concepts of the present invention.

With reference to the FIG. 3 array, and to the NVM cell structure 114 shown in FIG. 4, in the programming mode, the deep N-well (DNW) is at the programming voltage, e.g. 5-6V. All of the selected sources S and drains D (see FIG. 4) of the PMOS transistor 102 are grounded (i.e., bit lines Pi, Ri in FIG. 3). Unselected sources S and drains D are at the programming voltage, or floating, or at a positive inhibiting voltage (e.g., half of the programming voltage). The control gates CG (word lines WLi in FIG. 3) are at the programming voltage (e.g. 5-6V) for selected cells and grounded for unselected cells, assuming high coupling to the floating gate. Thus, both junctions of the selected PMOS devices are in the conditions that cause band-to-band tunneling and electron injection into the floating gate. The channel of the transistor is off; therefore, the drain current is low. Injection of electrons into the floating gate causes a negative shift of its potential, thereby programming the cell.

With continuing reference to FIGS. 3 and 4, in the erase mode, the deep well DNW is at a high erase voltage, e.g. 10-12V. The sources S and drains D of all PMOS devices 102 are at the same high erase voltage (alternatively, they may be floating). All of the control gates CG are grounded, assuming high coupling to the floating gate. Erasing is traditionally performed by tunneling from the floating gate FG to the N-well 106 for all cells simultaneously.

Still referring to FIGS. 3 and 4, in the read mode, the deep well DNW is at a read voltage, e.g. 1-3V. All of the sources S of the PMOS devices (Pi in FIG. 3) are at the same read voltage. The drains D (Ri in FIG. 3) of selected cells should be grounded; for unselected cells, the drains D should be either at the read voltage or floating. The control gates CG are grounded for selected cells and at the read voltage for unselected cells, assuming high coupling to the floating gate. The channel of the PMOS device 102 is on or off depending upon previous programming and erasing operations. After programming, a substantial current through the PMOS 102 device can be detected in the conventional manner.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of erasing an NVM cell structure formed on a deep well of N-type semiconductor material, wherein the NVM cell structure includes a PMOS transistor formed in an N-type well, the PMOS transistor including spaced-apart p-type source and drain regions defining an n-type channel region therebetween, an NMOS transistor formed in a P-type well that is adjacent to the N-type well, the NMOS transistor including spaced-apart n-type source and drain regions defining a p-type channel region therebetween, a conductive floating gate that includes a first section that extends over the n-type channel region of the PMOS transistor and is separated therefrom by intervening dielectric material and a second section that extends over the p-type channel region and is separated therefrom by intervening dielectric material, and a conductive control gate formed over at least a portion of the second section of the floating gate and separated therefrom by intervening dielectric material, the erasing method comprising:

biasing the deep N-type well at a selected erase voltage;

holding the source region of the PMOS transistor at the erase voltage or floating;

holding the drain region of the PMOS transistor at the erase voltage or floating; and holding the control gate at ground for a preselected erase time.

2. The method of claim 1, wherein the erase voltage is about 10-12V.

\* \* \* \* \*